(12) United States Patent
Kim et al.

(10) Patent No.: US 10,707,187 B2
(45) Date of Patent: Jul. 7, 2020

(54) SEMICONDUCTOR DEVICE AND METHOD FOR MANUFACTURING SEMICONDUCTOR DEVICE

(71) Applicant: LG Chem, Ltd., Seoul (KR)

(72) Inventors: Jung Hak Kim, Daejeon (KR); Hee Jung Kim, Daejeon (KR); Se Ra Kim, Daejeon (KR); Jung Ho Jo, Daejeon (KR); Kwang Joo Lee, Daejeon (KR); Seung Hee Nam, Daejeon (KR); Young Kook Kim, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/757,197

(22) PCT Filed: Nov. 4, 2016

(86) PCT No.: PCT/KR2016/012676
§ 371 (c)(1),
(2) Date: Mar. 2, 2018

(87) PCT Pub. No.: WO2017/078469
PCT Pub. Date: May 11, 2017

(65) Prior Publication Data
US 2018/0261576 A1    Sep. 13, 2018

(30) Foreign Application Priority Data
Nov. 6, 2015    (KR) .................. 10-2015-0155906

(51) Int. Cl.
*H01L 25/065* (2006.01)
*H01L 23/00* (2006.01)
(Continued)

(52) U.S. Cl.
CPC .......... *H01L 25/0657* (2013.01); *H01L 21/56* (2013.01); *H01L 23/00* (2013.01);
(Continued)

(58) Field of Classification Search
CPC ............ H01L 25/0657; H01L 23/3164; H01L 23/3185; H01L 23/3107; H01L 23/49513; H01L 23/49575; H01L 25/50
See application file for complete search history.

(56) References Cited

U.S. PATENT DOCUMENTS 6,387,728 B1 * 5/2002 Pai ...................... H01L 25/0657
257/E21.705
7,119,426 B2 * 10/2006 Fukui ..................... H01L 24/83
257/686
(Continued)

FOREIGN PATENT DOCUMENTS

CN        1505150 A      6/2004
CN      101095215 A     12/2007
(Continued)

OTHER PUBLICATIONS

Search report from International Application No. PCT/KR2016/012676, dated Feb. 13, 2017.
(Continued)

*Primary Examiner* — Nathan W Ha
(74) *Attorney, Agent, or Firm* — Lerner, David, Littenberg, Krumholz & Mentlik, LLP

(57) ABSTRACT

The present invention relates to a semiconductor device and a method of manufacturing a semiconductor device, and more particularly, to a semiconductor device capable of reducing the uppermost semiconductor chip damage and stably performing wire bonding even if an excessive force is applied during a die bonding process or a wire bonding process, and a method for manufacturing the semiconductor device.

5 Claims, 2 Drawing Sheets

(51) Int. Cl.
*H01L 23/28* (2006.01)
*H01L 23/495* (2006.01)
*H01L 21/56* (2006.01)
*H01L 23/31* (2006.01)
*H01L 25/00* (2006.01)

(52) U.S. Cl.
CPC .......... *H01L 23/28* (2013.01); *H01L 23/3107* (2013.01); *H01L 23/49513* (2013.01); *H01L 23/49575* (2013.01); *H01L 24/29* (2013.01); *H01L 24/32* (2013.01); *H01L 24/83* (2013.01); *H01L 25/50* (2013.01); *H01L 23/3121* (2013.01); *H01L 24/45* (2013.01); *H01L 24/48* (2013.01); *H01L 24/73* (2013.01); *H01L 24/85* (2013.01); *H01L 24/92* (2013.01); *H01L 2224/2919* (2013.01); *H01L 2224/2929* (2013.01); *H01L 2224/29386* (2013.01); *H01L 2224/32145* (2013.01); *H01L 2224/32225* (2013.01); *H01L 2224/32245* (2013.01); *H01L 2224/45015* (2013.01); *H01L 2224/45144* (2013.01); *H01L 2224/48091* (2013.01); *H01L 2224/48227* (2013.01); *H01L 2224/48247* (2013.01); *H01L 2224/73265* (2013.01); *H01L 2224/83203* (2013.01); *H01L 2224/83385* (2013.01); *H01L 2224/83862* (2013.01); *H01L 2224/92247* (2013.01); *H01L 2225/0651* (2013.01); *H01L 2924/15311* (2013.01)

(56) References Cited

U.S. PATENT DOCUMENTS

| | | | |
|---|---|---|---|
| 8,106,523 B2 * | 1/2012 | Kanagawa | C08K 3/36 257/793 |
| 2005/0253229 A1 | 11/2005 | Fukui et al. | |
| 2007/0126129 A1 | 6/2007 | Ahn et al. | |
| 2008/0157393 A1 | 7/2008 | Kodama et al. | |
| 2008/0241995 A1 | 10/2008 | Fukui et al. | |
| 2010/0127615 A1 | 5/2010 | Kim et al. | |
| 2010/0129960 A1 * | 5/2010 | Mejima | H01L 24/11 438/107 |
| 2010/0270688 A1 * | 10/2010 | Su | H01L 24/29 257/777 |
| 2010/0314740 A1 | 12/2010 | Choi et al. | |
| 2012/0270381 A1 | 10/2012 | Joo et al. | |
| 2013/0056871 A1 * | 3/2013 | Yu | H01L 23/3114 257/738 |
| 2013/0270717 A1 | 10/2013 | Ko et al. | |
| 2014/0091296 A1 * | 4/2014 | Yoo | C09J 11/00 257/40 |
| 2014/0203395 A1 * | 7/2014 | Tsai | H01L 21/56 257/528 |
| 2014/0299188 A1 * | 10/2014 | Hayashi | H01L 31/0481 136/259 |
| 2015/0060836 A1 * | 3/2015 | Shim | H05B 33/04 257/40 |
| 2015/0112014 A1 * | 4/2015 | Tripathy | C09J 123/10 524/528 |
| 2015/0260907 A1 * | 9/2015 | Yang | G02B 6/0088 362/606 |
| 2015/0311185 A1 * | 10/2015 | Ng | H01L 25/18 257/784 |
| 2015/0349288 A1 * | 12/2015 | Luo | H01L 51/5237 257/99 |
| 2015/0380061 A1 * | 12/2015 | Matsumoto | G11C 29/1201 365/51 |
| 2016/0326409 A1 * | 11/2016 | Tokuyasu | C08L 33/06 |
| 2016/0376406 A1 * | 12/2016 | de Jong | B27K 3/15 524/702 |
| 2017/0092796 A1 * | 3/2017 | Ishiguro | B32B 7/05 |
| 2017/0141022 A1 * | 5/2017 | Maruyama | H01L 23/24 |
| 2017/0365835 A1 * | 12/2017 | Ogata | B32B 27/20 |
| 2018/0362760 A1 * | 12/2018 | Imai | B29B 15/127 |
| 2019/0281697 A1 * | 9/2019 | Abe | C09D 4/00 |

FOREIGN PATENT DOCUMENTS

| | | |
|---|---|---|
| CN | 104726032 A | 6/2015 |
| JP | 2004158716 A | 6/2004 |
| JP | 2008166430 A | 7/2008 |
| JP | 2013508943 A | 3/2013 |
| JP | 2013157363 A | 8/2013 |
| JP | 2015122433 A | 7/2015 |
| KR | 20010099722 | 11/2001 |
| KR | 100593814 B1 | 6/2006 |
| KR | 20070022729 A | 2/2007 |
| KR | 20070048949 A | 5/2007 |
| KR | 20100057410 A | 5/2010 |
| KR | 20130117109 A | 10/2013 |
| KR | 20140027805 A | 3/2014 |
| KR | 20140062984 A | 5/2014 |
| KR | 20140129921 A | 11/2014 |
| KR | 20150043931 A | 4/2015 |

OTHER PUBLICATIONS

Japanese Search Report from Office Action for JP2018511720 dated Oct. 7, 2019.

\* cited by examiner

SEMICONDUCTOR DEVICE AND METHOD FOR MANUFACTURING SEMICONDUCTOR DEVICE

CROSS-REFERENCE TO RELATED APPLICATION(S)

This application is a national phase entry under 35 U.S.C. § 371 of International Application No. PCT/KR2016/012676 filed on Nov. 4, 2016, published in Korean, which claims priority to Korean Patent Application No. 10-2015-0155906 filed on Nov. 6, 2015 in Korea, the disclosures of which are hereby incorporated herein by reference.

TECHNICAL FIELD

The present invention relates to a semiconductor device and a method for manufacturing a semiconductor device, and more particularly, to a semiconductor device capable of reducing the uppermost semiconductor chip damage and stably performing wire bonding even if an excessive force is applied during a die bonding process or a wire bonding process, and a method for manufacturing the semiconductor device.

BACKGROUND OF ART

Generally, a manufacturing method of a semiconductor device includes a micropattern-forming process on a wafer and a packaging process wherein a wafer is ground to ] meet the size of the final device. The packaging process includes: a wafer inspection process during which defective semiconductor chips are inspected; a dicing process in which a wafer is cut and separated into individual chips; a die bonding process wherein the separated chips are attached to a mounting board of a circuit film or lead frame; a wire bonding process wherein a chip pad provided on a semiconductor chip is connected with a circuit pattern of the circuit film or lead frame via electrical connecting means such as wire; a molding process wherein the exterior of the semiconductor is wrapped with a packaging material in order to protect the internal circuit and other parts of the semiconductor chip; a trimming process wherein a dam bar connecting leads is broken; a forming process wherein the leads are bent to obtain a desired form; and a final product testing process to inspect defects in a packaged product.

Broadly, the dicing process is a process of manufacturing a plurality of individual chips separated from each other by grinding a back surface of a semiconductor wafer and cutting the semiconductor wafer along a dicing line between the chips. Through the dicing process, individual chips separated from each other are manufactured from a semiconductor wafer on which a plurality of chips are formed.

In the die bonding process, one or a plurality of individual semiconductor chips thus prepared are attached to a substrate or the like by a die bonding film or the like, and a die bonding process wherein the separated chips are attached to a mounting board of a circuit film or lead frame, and a chip pad provided on a semiconductor chip thus attached is connected with a circuit pattern of the circuit film or lead frame by electrical connecting means such as a wire through a wire bonding process.

However, in accordance with the thinning of the semiconductor chip, when an excessive force is applied in the die bonding process or the wire process, there is a problem that damage occurs on an uppermost thinned chip.

DETAILED DESCRIPTION OF THE INVENTION

Technical Problem

It is an object of the present invention to provide a semiconductor device capable of reducing the uppermost semiconductor chip damage and stably performing wire bonding during a die bonding process or a wire bonding process, and a method for manufacturing the semiconductor device.

Technical Solution

In order to achieve these objects, the present invention provides a semiconductor device comprising a substrate; a first semiconductor chip die-bonded by a first die bonding layer onto the substrate; and a second semiconductor chip die-bonded by a second die bonding layer onto the first semiconductor chip, wherein the second die bonding layer is formed so as to mold a region not overlapping with a region of the first semiconductor chip in the lower region of the 10 second semiconductor chip.

The semiconductor device may further comprise one to five die-bonded semiconductor chips between the substrate and the first die bonding layer.

And, the first die bonding layer and the second die bonding layer may include an adhesive layer containing an epoxy resin and a curing agent.

In addition, the adhesive layer may preferably have a viscosity before curing of 3,000 Pa·s or less at 130° C.

Further, the first and second die bonding layers may preferably have a thickness of 1 to 160 um.

Meanwhile, the present invention relates to a method for manufacturing a semiconductor device comprising the steps of: die-bonding a first semiconductor chip including a first die bonding film in the lower portion onto a substrate; and die-bonding a second semiconductor chip containing a second die bonding film in the lower portion on the first semiconductor chip, wherein the second die bonding film is die-bonded so as to mold a region not overlapping with a region of the first semiconductor chip in the lower region of the second semiconductor chip.

According to an embodiment, before the step of die-bonding the first semiconductor chip, the method may further include a step of die-bonding one to five semiconductor chips on the substrate+.

And, the first die bonding film and the second die bonding film may include an adhesive layer containing an epoxy resin and a curing agent.

The adhesive layer may preferably have a viscosity before curing of 3,000 Pa·s or less at 130° C.

Advantageous Effects

The semiconductor device of the present invention can prevent the uppermost semiconductor chip from being damaged and stably perform wire bonding even if an excessive force is applied during a die bonding process or a wire bonding process.

Further, according to the method for manufacturing a semiconductor device of the present invention, the semiconductor device can be manufactured by a simple method.

DETAILED DESCRIPTION OF THE EMBODIMENTS

Figure 1:
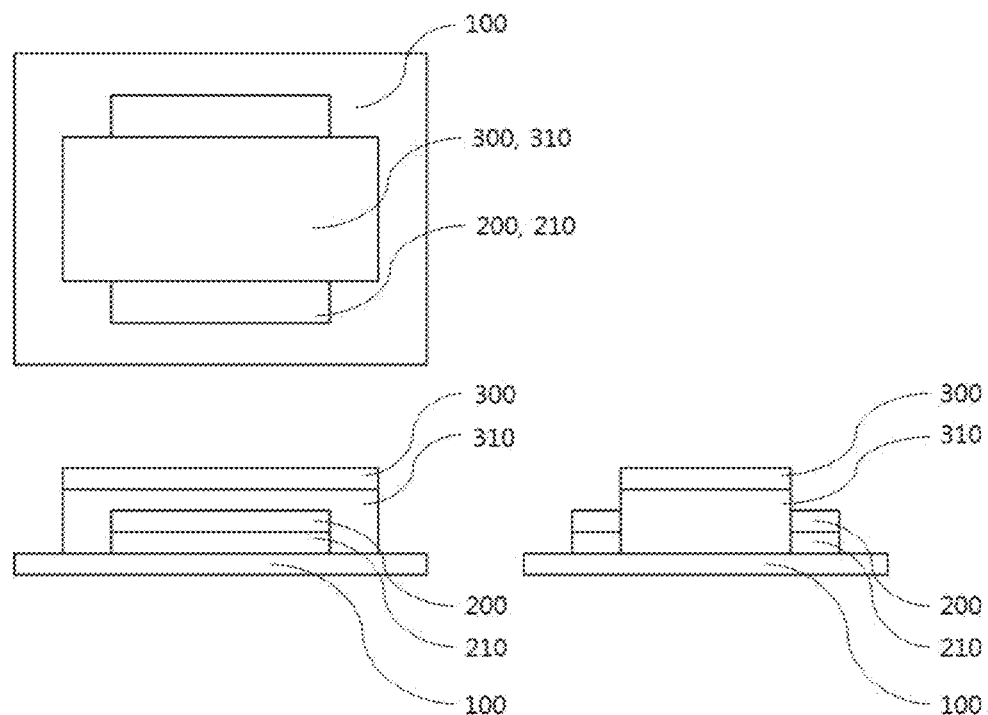
FIG. 1 shows an orthographic projection image of the semiconductor device according to an embodiment of the present invention.

The semiconductor device of the present invention comprises a substrate; a first semiconductor chip die-bonded by a first die bonding layer onto the substrate; and a second semiconductor chip die-bonded by a second die bonding layer onto the first semiconductor chip, wherein the second die bonding layer is formed so as to mold a region not overlapping with a region of the first semiconductor chip in the lower region of the second semiconductor chip.

Also, the method for manufacturing a semiconductor device of the present invention comprises the steps of: die-bonding a first semiconductor chip including a first die bonding film in the lower portion onto a substrate; and die-bonding a second semiconductor chip containing a second die bonding film in the lower portion on the first semiconductor chip, wherein the second die bonding film is die-bonded so as to mold a region not overlapping with a region of the first semiconductor chip in the lower region of the second semiconductor chip.

As used herein, the terms first, second, etc. can be used to describe various components, and these terms are used only for the purpose of distinguishing one component from the other component.

Further, the terms used herein are used only to describe exemplary embodiments, and are not intended to limit the present invention. A singular expression may include a plural expression unless the context clearly indicates otherwise. In the present application, it will be understood that terms "comprise" or "have" used herein are intended to refer to the presence of sated features, integers, steps, components, or combinations thereof, but not to preclude the existence or addition of one or more other features, integers, steps, components, or combinations thereof.

Further, in the present invention, when a layer or an element is referred to as being "on" or "over" layers or elements, it means that each layer or element can be formed directly on the layer or element, or the other layer or element can be additionally formed between respective layers, or on an object or a substrate.

While the present invention is susceptible to various modifications and alternative forms, specific embodiments will be illustrated and described in detail as follows. It should be understood, however, that the description is not intended to limit the present invention to the particular forms disclosed, but on the contrary, the intention is to cover all modifications, equivalents, and alternatives falling within the spirit and scope of the invention.

Hereinafter, the present invention will be described in more detail.

According to an embodiment of the present invention, there is provided a semiconductor device comprising: a substrate; a first semiconductor chip die-bonded by a first die bonding layer onto the substrate; and a second semiconductor chip die-bonded by a second die bonding layer onto the first semiconductor chip, wherein the second die bonding layer is form so as to mold a region not overlapping with a region of the first semiconductor chip in the lower region of the second semiconductor chip.

The phrase "region not overlapping with a region of the first semiconductor chip in the lower region of the second semiconductor chip" means an empty space between the projecting portion and the substrate when the lower portion of the second semiconductor chip protrudes to the outside of the upper surface of the first semiconductor chip, in a case where the first semiconductor chip and the second semiconductor chip are not laminated in a completely overlapping manner, The phase "is formed so as to mold a region not overlapping" means that the second die bonding layer is formed so as to fill an empty space between the protruding portion and the substrate.

FIG. 1 shows an orthographic projection image of the semiconductor device according to an embodiment of the present invention.

Referring to FIG. 1, it is confirmed that the semiconductor device of the present invention comprises: a substrate 100; a first semiconductor chip 200 die-bonded by a first die bonding layer 210 onto the substrate; and a second semiconductor chip 300 die-bonded by a second die bonding layer 310 onto the first semiconductor chip, wherein the second die bonding layer 310 is made so as to mold a region not overlapping with a region of the first semiconductor chip in the lower region of the second semiconductor chip.

In general, semiconductor chips are manufactured by attaching a lower portion of the semiconductor wafer, completely dividing or partially dividing the semiconductor wafer, irradiating ultraviolet light onto a dicing die-bonding film and a dicing film of the semiconductor wafer to lower the adhesive strength between the semiconductor wafer die-bonding film and the dicing film, and then picking up individual chips separated by the division of the semiconductor wafer.

These semiconductor chips are laminated in the form of a plurality of layers by a die bonding film on a substrate, and the chip pads provided on each of the laminated semiconductor chips are connected with the circuit patterns of the circuit film or the lead frame through a wire bonding process.

However, when the semiconductor chips are laminated in the form of a plurality of layers, the upper chips and the lower chips are laminated in a completely overlapping manner so as to secure a space for connecting with the circuit film or the circuit pattern of the substrate via the wires.

Therefore, when an excessive force is applied to the non-overlapping portion during the die bonding process or the wire bonding process, damages may occur on an uppermost thinned chip.

In this regard, the present inventors has found that, when the die bonding layer of the semiconductor chip to be laminated on the upper portion is laminated so as to mold a portion which does not overlap with the lower semiconductor chip, it is possible to prevent the semiconductor chip from being damaged, thereby completing the present invention.

Figure 2:
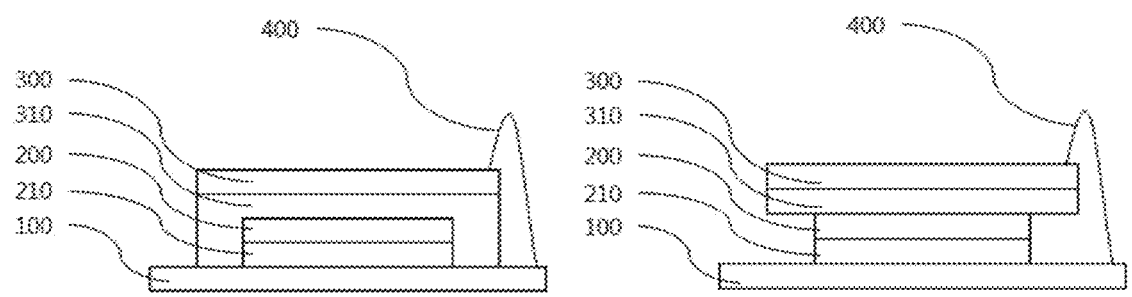
FIG. 2 illustrates that wire bonding is applied to a semiconductor device according to an embodiment of the present invention.

FIG. 2 illustrates that wire bonding is applied to a semiconductor device according to an embodiment of the present invention.

Referring to FIG. 2, in the case of general die bonding as shown on the right side, it can be confirmed that a part of the uppermost semiconductor chip protrudes to the outside without directly contacting the base semiconductor chip. Therefore, when an excessive force is applied to this part during the wire 400 bonding process, damages may occur to the uppermost thinned chip, and previously bonded wires can be damaged by a fine vibration of chips due to the wire bonding vibration.

However, in the case of die bonding as shown on the left side, since the molding due to the die bonding layer is formed on the portion where the uppermost semiconductor chip protrudes to the outside without directly contacting the base semiconductor chip, it is possible to secure the stability of the uppermost semiconductor chip. Therefore, even if an excessive force is applied to this portion during the wire 400 bonding process, it is possible to prevent the semiconductor chip from being damaged and to prevent the previously bonded wire from being damaged by a fine vibration of chips due to the wire bonding vibration.

According to an embodiment of the present invention, the semiconductor device may further include one to five die-bonded semiconductor chips between the substrate and the first die bonding layer. That is, even in the case of a semiconductor device in which not only two semiconductor chips are laminated but also a semiconductor device in which more than two of a plurality of other semiconductor chips are laminated, the die bonding layer of the semiconductor chip laminated on the upper portion can be laminated in the form of molding a portion which does not overlap with a lower semiconductor chip. In addition, the first and second die bonding layers may be formed of the same or different components from each other.

The first die bonding layer and the second die bonding layer may include an adhesive layer including an epoxy resin and a curing agent, and the adhesive layer may be present in a cured form. The first and second die bonding layers may be formed of the same or different components.

The epoxy resin that can be used in the present invention may include an epoxy resin for general adhesive agent known in this field, and for example, an epoxy resin containing two or more epoxy groups in a molecule and having a weight average molecular weight of 100 to 2,000 can be used. The above-mentioned epoxy resin can form a hard crosslinked structure through a curing process, thereby exhibiting excellent adhesion strength, heat resistance and mechanical strength.

More specifically, in the present invention, it is particularly preferable to use an epoxy resin having an average epoxy equivalent of 100 to 1,000. If the epoxy equivalent of the epoxy resin is less than 100, the crosslinking density becomes too high, and the adhesive film may exhibit a hard property as a whole. If the epoxy equivalent is more than 1,000, the heat resistance may be decreased.

Examples of such an epoxy resin include one or more selected from a bifunctional epoxy resin such as a bisphenol A epoxy resin and a bisphenol F epoxy resin; or a multi-functional epoxy having three or more functional groups such as a cresol novolac epoxy resin, a phenol novolac epoxy resin, a tetrafunctional epoxy resin, a biphenyl type epoxy resin, a triphenolmethane type epoxy resin, an alkyl modified triphenolmethane type epoxy resin, a naphthalene type epoxy resin, a dicyclopentadiene type epoxy resin or a dicyclopentadiene-modified phenol type epoxy resin, but it is not limited thereto.

In the present invention, it is particularly preferable to use a mixed resin of a difunctional epoxy resin and a multifunctional epoxy resin as the epoxy resin. As used herein, the term "multifunctional epoxy resin" refers to an epoxy resin having three or more functional groups. That is, generally, the bifunctional epoxy resin is excellent in flexibility and flowability at high temperature, but the heat resistance and the curing rate are lowered, whereas the multifunctional epoxy resin having three or more functional groups has a high curing rate and shows excellent heat resistance owing to its high crosslinking density but its flexibility and flowability are lowered.

Therefore, by suitably mixing and using two kinds of the resins, the elastic modulus and tack characteristics of the adhesive layer can be controlled. In particular, when laminating the second semiconductor chip, the second die bonding layer may be formed so as to mold a region not overlapping with a region of the first semiconductor chip by using excellent flexibility and flowability.

In addition, the adhesive layer may further include a low-elastic high-molecular weight resin. The low-elastic high-molecular weight resin can serve to form soft segments in the adhesive agent and impart stress relaxation characteristics at high temperature. In the present invention, it is blended with the epoxy resin as the high-molecular weight resin and can exhibit viscoelasticity after formation of the crosslinked structure, without causing cracking during film formation, and any resin component can be used as long as it is excellent in a compatibility with other components and a storage stability.

The specific type of the low-elastic high-molecular weight resin is not particularly limited as long as it satisfies the above-mentioned characteristics. For example, in the present invention, polyimide, polyether imide, polyester imide, polyamide, polyether sulfone, polyether ketone, polyolefin, polyvinyl chloride, phenoxy, reactive acrylonitrile butadiene rubber or acrylic resin is used alone, or mixtures of two or more thereof can be used. However, the present invention is not necessarily limited thereto.

Specific examples of the acrylic resin include acrylic copolymers containing (meth)acrylic acid and derivatives thereof. Examples of the (meth)acrylic acid and derivatives thereof include (meth)acrylic acid; alkyl (meth)acrylates containing an alkyl group having 1 to 12 carbon atoms such as methyl(meth)acrylate or ethyl(meth)acrylate; (meth)acrylonitrile or (meth)acrylamide; and other copolymerizable monomers.

The acrylic resin may further contain one or more kinds of functional groups such as a glycidyl group, a hydroxyl group, a carboxyl group and an amine group. Such functional groups can be introduced by copolymerizing monomers such as glycidyl(meth)acrylate, hydroxy(meth)acrylate, hydroxyethyl(meth)acrylate or carboxy (meth)acrylate.

The curing agent that can be included in the adhesive composition is not particularly limited as long as it can react with the epoxy resin and/or the low-elastic high-molecular weight resin to form a crosslinked structure. For example, in the present invention, a curing agent capable of reacting simultaneously with the two components to form a crosslinked structure can be used, and such a curing agent forms a crosslinked structure with soft segments and hard segments in an adhesive agent to improve heat resistance and at the same time it can act as a crosslinking agent for two segments at the interface therebetween, thus improving the reliability of the semiconductor device.

In addition, the above-described adhesive composition may further include a filler for adjusting handling property, heat resistance, and melt viscosity. The type of filler that can be used in the present invention is not particularly limited, and generally, organic and inorganic fillers can be used, and preferably, inorganic fillers can be used. As specific examples of the inorganic filler, silica, alumina, calcium carbonate, magnesium hydroxide, aluminum oxide, talc, or aluminum nitride, etc. can be used alone or in combination of two or more, but it is not limited thereto. Further, an ion adsorbent capable of adsorbing ionic impurities and improving reliability can be used as an inorganic filler.

Such an ion adsorbent is not particularly limited, and magnesium-based compounds including magnesium hydroxide, magnesium carbonate, magnesium silicate, magnesium oxide and the like; calcium-based compounds including calcium silicate, calcium carbonate, calcium oxide and the like; aluminum-based compounds including alumina, aluminum hydroxide, aluminum nitride, aluminum borate whisker and the like; zirconium-based compounds; antimony-based compounds; bismuth-based compounds, and the like can be used, or a mixture of two or more thereof may be used.

Also, the filler may have an average particle size of about 0.001 um to about 10 um, preferably about 0.005 um to 1 um. If the average particle diameter is less than 0.001 um, the filler may aggregate in the adhesive layer or an appearance defect may occur. When it exceeds 10 um, it may cause problems such as protrusion of the filler on the surface of the adhesive layer, damage of a chip during thermocompression bonding, deterioration of adhesiveness.

The filler may be contained in the adhesive composition in an amount of about 0.5 parts by weight to about 120 parts by weight, preferably about 5 parts by weight to about 100 parts by weight, based on 100 parts by weight of the total resin excluding the filler. If the content is less than about 0.5 part by weight, the effects of improving heat resistance and handling property due to the addition of fillers may not be sufficient. When the content is more than about 120 parts by weight, workability and substrate adhesion property are lowered, and the molding property and adhesive strength can be lowered due to an increase in the viscosity at high temperature.

The adhesive composition may further include a curing agent together with the above-described components. The curing agent is not particularly limited as long as it can form a crosslinked structure with the above-mentioned epoxy resin and/or thermoplastic resin. In one embodiment of the present invention, the curing agent can react with both the epoxy resin and the thermoplastic resin to form a crosslinked structure. Such a curing agent has a crosslinked structure with each of a thermoplastic resin forming a soft segment and an epoxy resin forming a hard segment in the composition to improve heat resistance and at the same time can serve as a linking ring at the interface of the above components, thereby improving the reliability of the semiconductor package.

Specific examples of the curing agent may include a multifunctional phenol resin, and it is more preferable to use a multifunctional phenol resin having a hydroxyl group equivalent of about 100 to about 1,000. When the hydroxyl group equivalent of the phenolic resin is less than about 100, the cured product with the epoxy resin has a hard property and the buffering properties of the semiconductor package may be deteriorated. If the hydroxyl group equivalent exceeds about 1,000, the crosslink density is lowered and so the heat resistance of the composition may be lowered.

Further, the curing agent may have a softening point of about 60° C. to about 140° C. If the softening point of the curing agent is less than about 60° C., there is a risk that, due to the increase of the tack characteristics, the B-stage elastic modulus of the adhesive film may decrease or the processability such as the pick-up property may deteriorate. In particular, the viscosity becomes excessively low at a high temperature, and so there is a fear that the high-temperature adhesive strength is lowered. When the softening point exceeds about 140° C., the adhesion property of the wafer is lowered, which may cause a problem such as scattering of chips during dicing.

Examples of the multifunctional phenol resin as described above may include xylok novolac resin, bisphenol F resin, bisphenol F novolac resin, bisphenol A resin, phenol novolac resin, creosol novolac resin, bisphenol A novolac resin, phenol aralkyl resin, multifunctional novolac resin, dicyclopentadiene phenol novolac resin, aminotriazine phenol novolac resin, polybutadiene phenol novolac resin, or biphenyl type resin, and the like, and these can be used alone or in combination of two or more.

It is preferable that the aforementioned curing agent is included in the composition in an amount of about 0.4 to 2 equivalent ratio, preferably about 0.5 to about 1.8 equivalent ratio, relative to epoxy equivalent of epoxy resin. When the curing agent is contained in an amount of less than about 0.4 equivalent ratio, it may cause problems that unreacted epoxy after curing increases and so the glass transition temperature and heat resistance are lowered, or a high temperature state needs to be maintained for a long time for reaction of unreacted epoxy group. If the curing agent is contained in an amount exceeding about 2 equivalents ratio, moisture absorption rate, storage stability, dielectric properties, etc. of the composition may be deteriorated due to unreacted hydroxyl groups.

Further, according to one embodiment of the present invention, the adhesive layer can have a viscosity before curing of about 3000 Pa·s or less at about 130° C., preferably from about 50 to 2500 Pa·s, and more preferably about 100 to about 2000 Pa·s. In particular, it is desirable that the viscosity of the adhesive layer contained in the second die bonding layer is within the above range. When the adhesive layer of the die bonding film is within the viscosity range as described above, the die bonding process can proceed smoothly, and particularly when laminating the second semiconductor chip, the second die bonding layer can be formed so as to mold a region not overlapping with a region of the first semiconductor chip by utilizing excellent flexibility and flowability, even when a low pressure of about 0.5 kg/cm$^2$ to about 4 kg/cm$^2$ is applied.

In addition, the temperature in the step of attaching the chips is preferably about 80° C. to about 180° C., and the attachment time may be preferably about 0.5 seconds to about 3 seconds, and the attachment pressure is about 0.5 kg/cm$^2$ to 4 kg/cm$^2$.

In addition, the die bonding film may further comprise a pressure-sensitive adhesive layer including an ultraviolet-curable pressure-sensitive adhesive agent. The die bonding film may be present in the form of attaching to the lower portion of the semiconductor chip by the pressure-sensitive adhesive layer. That is, the die bonding film may be attached to a semiconductor wafer, and then irradiated with ultraviolet rays to be cured, and the semiconductor wafer semiconductor may be divided and manufactured in the form of a semiconductor chip in which a die bonding film is attached to the lower portion.

The ultraviolet curable pressure-sensitive adhesive may include an acrylic resin, a photoinitiator, and a crosslinking agent.

The acrylic resin may have a weight average molecular weight of 100,000 to 1,500,000, preferably 200,000 to 100,000. If the weight average molecular weight is less than 100,000, the coating property or the cohesive force is lowered, and residual materials may remain on the surface of the adherend upon peeling or a breakdown phenomenon of the adhesive may occur. Meanwhile, if the weight average molecular weight exceeds 1,500,000, the base resin may inhibit the reaction of the ultraviolet curable compound and the peeling force may not be efficiently reduced.

The acrylic resin may be, for example, a copolymer of a (meth)acrylic acid ester monomer and a crosslinkable functional group-containing monomer. In this case, examples of the (meth)acrylic acid ester-based monomer may include alkyl(meth)acrylate, more specifically monomers having an alkyl group having 1 to 12 carbon atoms, for example, one or a mixture of two or more selected from pentyl(meth)acrylate, n-butyl(meth)acrylate, ethyl(meth)acrylate, methyl (meth)acrylate, hexyl(meth)acrylate, n-octyl(meth)acrylate, isooctyl (meth)acrylate, 2-ethylhexyl (meth)acrylate, dodecyl(meth)acrylate, or decyl(meth)acrylate.

In addition, the crosslinkable functional group-containing monomer contained in the copolymer serves to impart to the copolymer a functional group capable of reacting with a crosslinking agent or an ultraviolet curable compound described later, thereby controlling the durable reliability, adhesion strength and cohesive force of the pressure-sensitive adhesive agent. Examples of the crosslinkable functional group-containing monomer include one or a mixture of two or more selected from a hydroxyl group-containing monomer, a carboxyl group-containing monomer, or a nitrogen-containing monomer. In this case, examples of the hydroxyl group-containing compound include one or a mixture of two or more selected from 2-hydroxyethyl(meth)acrylate, 2-hydroxypropyl(meth)acrylate, 4-hydroxybutyl (meth)acrylate, 6-hydroxyhexyl(meth)acrylate, 8-hydroxyoctyl(meth)acrylate, 2-hydroxyethylene glycol (meth) acrylate, 2-hydroxypropylene glycol(meth)acrylate and the like, and examples of the carboxyl group-containing compound may include (meth)acrylic acid, 2-(meth)acryloyloxyacetic acid, 3-(meth)acryloyloxypropyl acid, 4-(meth)acryloyloxybutyric acid, acrylic acid dimer, itaconic acid, maleic acid, or maleic anhydride, and examples of the nitrogen-containing monomer may include (meth)acrylonitrile, N-vinylpyrrolidone, N-vinylcaprolactam, and the like, but are not limited thereto. The acrylic resin may further contain vinyl acetate, styrene or acrylonitrile, etc. from the viewpoint of the improvement of ether functionality such as compatibility.

Further, the kind of the ultraviolet curable compound that can be used in the present invention is not particularly limited and includes, for example, a multifunctional compound having a weight average molecular weight of about 500 to 300,000 (e.g., a multifunctional methane acrylate, a multifunctional acrylate monomer, an oligomer, etc.) can be used. It will be apparent to those skilled in the art that a compound suitable for a desired use can be easily selected.

The ultraviolet curable compound can be contained in an amount of 5 to 400 parts by weight, preferably 10 to 200 parts by weight based on 100 parts by weight of the above-mentioned base resin. If the content of the ultraviolet curable compound is less than 5 parts by weight, a reduction in the pressure-sensitive adhesive force after curing is not sufficient and so the pickup property may be decreased. Meanwhile, if the content exceeds 400 parts by weight, the cohesive force of the pressure sensitive adhesive agent before ultraviolet ray irradiation become insufficient, or peeling of the release film or the like may not be easily performed.

The ultraviolet curable pressure-sensitive adhesive agent may include not only the additive-type ultraviolet curable compound but also the acrylic copolymer in a form in which a carbon-carbon double bond is bonded to the side chain or main chain terminal.

That is, the acrylic copolymer may further include an ultraviolet curable compound bonded to the side chain of the main chain containing the (meth)acrylic acid ester-based monomer and the crosslinkable functional group-containing monomer.

The kind of the compound as described above contains 1 to 5, preferably 1 or 2, photocurable functional groups (e.g., ultraviolet polymerizable carbon-carbon double bond) per molecule, and is not particularly limited as long as it has a functional group capable of reacting with a crosslinkable functional group contained in the main chain. In this case, examples of the functional group capable of reacting with a crosslinkable functional group of the main chain may include an isocyanate group, an epoxy group or the like, but is not limited thereto.

Specific examples of the ultraviolet polymerizable group-containing compound include a functional group capable of reacting with a hydroxyl group contained in the main chain, and include one or more selected from (meth)acryloyloxyisocyanate, (meth)acryloyloxymethyl isocyanate, 2-(meth)acryloyloxyethyl isocyanate, 3-(meth)acryloyloxypropyl isocyanate, 4-(meth)acryloyloxy-butyl butyl isocyanate, m-propenyl-α,α-dimethyl benzyl isocyanate, methacryloyl isocyanate or allyl isocyanate; acryloyl monoisocyanate compound obtained by reacting a diisocyanate compound or a polyisocyanate compound with 2-hydroxyethyl (meth)acrylate; an acryloyl monoisocyanate compound obtained by reacting a diisocyanate compound or a polyisocyanate compound, a polyol compound and 2-hydroxyethyl (meth)acrylate; or glycidy(meth)acrylate, allyl glycidyl ether or the like including a functional group capable of reacting with a carboxyl group contained in the main chain, but it is not limited thereto.

The ultraviolet curable compound as described above can be contained in the side chain of the base resin by replacing 5 to 90 mol % of the crosslinkable functional group contained in the main chain. If the substitution amount is less than 5 mol %, reduction in the peeling force due to ultraviolet irradiation may not be sufficient. If the substitution amount is more than 90 mol %, the cohesive force of the pressure-sensitive adhesive agent before ultraviolet irradiation may decrease.

The kind of the photoinitiator is not particularly limited, and common initiators known in the art can be used. The content of the photoinitiator can be 0.05 to 20 parts by weight based on 100 parts by weight of the ultraviolet curable compound. If the content of the photoinitiator is less than 0.05 part by weight, the curing reaction by the ultraviolet irradiation may be insufficient and so the pick-up properties can be reduced. If the content of the photoinitiator is more than 20 parts by weight, the crosslinking reaction may occur in a short unit in the curing process, or an unreactive ultraviolet curable compound may be generated whereby residual materials remains on the surface of the adherend, or the peel strength after curing may be excessively lowered, thereby decreasing the pick-up properties. Further, the kind of the crosslinking agent included in the pressure-sensitive adhesive part and endowing the adhesive strength and cohesive force is not particularly limited. As the crosslinking agent, a typical compound such as an isocyanate-based compound, an aziridine-based compound, an epoxy-based compound, or a metal chelate-based compound can be used. The crosslinking agent may be contained in an amount of 0.5 to 40 parts by weight, and preferably 0.5 to 20 parts by weight, relative to 100 parts by weight of the base resin. If the content of the crosslinking agent is less than 0.5 parts by weight, the cohesive force of the pressure-sensitive adhesive agent may become insufficient. If the content of the crosslinking agent is more than 20 parts by weight, the chips may be scattered due to a shortage of the pressure sensitive adhesive force before the ultraviolet irradiation.

In the present invention, the pressure-sensitive adhesive layer may further include a tackifying agent such as a rosin resin, a terpene resin, a phenol resin, a styrene resin, an aliphatic petroleum resin, an aromatic petroleum resin, or an aliphatic petroleum resin, and an aliphatic-aromatic copolymer petroleum resin.

According to another embodiment of the present invention, the first and second die bonding layers may have a thickness of about 1 to about 160 um, preferably about 15 to about 120 um, and more preferably about 20 to 100 um. When the thickness of the die-bonding film before lamination is within the above range, molding with the second die-bonding layer can be preferably performed.

In addition, the semiconductor device according to an embodiment of the present invention may have a configuration in which the outermost side is molded with an external protective layer 500. In other words, the semiconductor device has a configuration in which the entire outer surface of the semiconductor device is covered with a semiconductor encapsulating material (packaging material). In order to protect the semiconductor chip from the external environment, electrically isolate the semiconductor chip from the outside, and effectively release the heat generated during the operation of the semiconductor chip, it is preferable that the semiconductor device has a configuration in which it is molded with an epoxy molding compound (ECM) or the like.

Meanwhile, according to another embodiment of the present invention, there is provided a method for manufacturing a semiconductor device comprising the steps of: die-bonding a first semiconductor chip including a first die bonding film in the lower portion onto a substrate; and die-bonding a second semiconductor chip containing a second die bonding film in the lower portion on the first semiconductor chip, wherein the second die bonding film is die-bonded in the form of molding a region not overlapping with a region of the first semiconductor chip in the lower region of the second semiconductor chip.

According to an embodiment, before the step of die-bonding the first semiconductor chip, the method may further include a step of die-bonding one to five semiconductor chips on the substrate. The case where two or more semiconductor chips are laminated is as described above.

In addition, the first die bonding film and the second die bonding film may include an adhesive layer containing an epoxy resin and a curing agent, and the adhesive layer may preferably have a viscosity before curing of 3,000 Pa·s or less at 130° C.

The characteristics of the first die bonding film, the second die bonding film, and the adhesive layer are as described above in the explanation part of the semiconductor device.

Hereinafter, the action and effect of the invention will be described in more detail through specific examples of the invention. It is to be understood, however, that these examples are provided only for illustration of the invention and are not intended to limit the scope of the invention.

PRODUCTION EXAMPLE

Production of a Dicing Film

Production Example 1

2-ethylhexyl acrylate, methyl acrylate, and methyl methacrylate were copolymerized to produce an acrylate-based copolymer (weight average molecular weight: 800,000 g/mol Tg: 10° C.).

5 parts by weight of an isocyanate curing agent and 10 parts by weight of a multifunctional oligomer having a weight average molecular weight of 20,000 were mixed with 100 parts by weight of the copolymer, and 0.7 part by weight of Darocur TPO (manufactured by Ciba) as a photoinitiator was mixed to produce an ultraviolet curable pressure sensitive adhesive composition.

The ultraviolet curing pressure-sensitive adhesive composition thus produced was coated onto a release-treated polyester film having a thickness of 38 um and dried at 110° C. for 3 minutes. The thickness of the coated composition after drying was 10 urn.

After the pressure-sensitive adhesive layer was dried, it was laminated on a polyolefin film having a thickness of 100 um to produce a dicing film.

Production of a Die Bonding Film

Production Example 2-1

40 parts by weight of butyl acrylate, 60 parts by weight of ethyl acrylate, 15 parts by weight of acrylonitrile and 10 parts by weight of glycidyl methacrylate were mixed with 100 parts by weight of a toluene solvent to obtain an acryl-based thermoplastic resin (weight average molecular weight: 700,000 g/mol, Tg: 10° C.).

To 50 parts by weight of the acryl-based thermoplastic resin, 150 parts by weight of EOCN-103s (cresol novolak type epoxy resin, manufacturer Nippon Kayaku, epoxy equivalent: 214, softening point: 83° C.) as an epoxy resin, 106 parts by weight of KPH-F2001 (phenol novolac type curing agent, manufacturer Kolon Industries, hydroxyl group equivalent: 106, softening point: 88° C.) as a curing agent, 5 parts by weight of A-187 (gamma-glycidoxypropyltrimethoxysilane, manufacturer GE Toshiba Silicones) as a silane coupling agent, 0.1 parts by weight of 2PZ (2-phenylimidazole, manufacturer Shikoku Chemical) as a curing accelerator, 100 parts by weight of SFP-30M (spherical silica powder, manufacturer Denka, average particle diameter 700 nm) as a filler, and methyl ethyl ketone were mixed with stirring to produce a varnish.

The varnish was coated onto a release-treated PET film having a thickness of 38 um and dried at 110° C. for 3 minutes to produce a die bonding film having a film thickness of 40 um.

Production Example 2-2

A die-bonding film was produced in the same manner as in Production Example 2-1, except that SFP-30M as a filler was used in an amount of 150 parts by weight.

Production Example 2-3

A die-bonding film was produced in the same manner as in Production Example 2-1, except that SFP-10X (spherical silica, manufacturer Denka, average particle size: 300 nm) instead of SFP-30M as a filler was used in an amount of 60 parts by weight.

Production Example 2-4

A die-bonding film was produced in the same manner as in Production Example 2-1, except that KH-6021 (bisphenol A type novolak type curing agent, manufacturer DIC Corp., softening point: 133° C.) was used instead of KPH-F2001 as a curing agent of an epoxy resin.

Comparative Production Example 2-5

A die-bonding film was produced in the same manner as in Production Example 2-1, except that SFP-30M as a filler was used in an amount of 300 parts by weight.

Comparative Production Example 2-6

A die-bonding film was produced in the same manner as in Production Example 2-1, except that the acrylic thermoplastic resin was used in an amount of 100 parts by weight instead of 50 parts by weight.

Comparative Production Example 2-7

A die-bonding film was prepared in the same manner as in Production Example 2-1, except that 150 parts by weight of SFP-10X (spherical silica, manufacturer Denka, average particle diameter, 300 nm) was used as a filler instead of SFP-30M.

Production of a Dicing Die-Bonding Film

Production Examples 3-1 to 3-4 and Comparative Production Examples 3-5 to 3-7

The respective die bonding films prepared in Production Examples 2-1 to 2-4 and Comparative Production Examples 2-5 to 2-7 were cut into a circular shape and then the die bonding films were laminated and transferred to the dicing film produced in Production Example 1 under the condition of 5 kgf/cm$^2$ to produce a dicing die-bonding film.

Production of a Semiconductor Device

Examples 1-1 to 1-4 and Comparative Examples 1-5 to 1-7

An 8-inch silicon wafer was mounted on a tape mounter (manufacturer DS hole) set at 40° C., and laminated with the dicing die bonding films of Production Examples 3-1 to 3-4 and Comparative Production Examples 3-5 to 3-7 for 10 seconds.

The dicing die-bonded silicon wafer (thickness of 40 mu) was processed into a size of a width of 10 mm and a length of 13 mm to produce a semiconductor chip.

(Lamination of a First Semiconductor Chip)

The semiconductor chip was pressed to a substrate (thickness: 0.5 mm, width: 60 mm, length: 230 mm) under conditions of 2 kgf/cm$^2$ and 125° C. for 2 seconds, die-bonded and then cured in an oven at 125° C. for 1 hour.

(Lamination of a Second Semiconductor Chip)

A second semiconductor chip of the same size was laminated on the first semiconductor chip, so as to cross the first semiconductor chip in a cross shape, and thus a region not overlapping with a region of the first semiconductor chip in the lower region of the second semiconductor chip was formed on both sides of the side surface of the first semiconductor (1.5 mm in width and 10 mm in length, respectively). Then, the chips were pressed under conditions of 2 kgf/cm$^2$ and 125° C. for 2 seconds, die-bonded and then cured in an oven at 125° C. for 1 hour, to manufacture a semiconductor device.

[Evaluation of Molding Property]

For the semiconductor devices manufactured in the above-described Examples and Comparative Examples.

After lamination of the second semiconductor chip, it was cured in an oven at 125° C. for 1 hour, and the cross section of the semiconductor device (laminate) was ground in the longitudinal direction of the second semiconductor chip, and whether molding was good or bad was determined with an optical microscope. The case where the second die bonding layer was formed so as to mold a region not overlapping with a region of the first semiconductor chip in the lower region of the second semiconductor chip was denoted by 0, and the case where the molding is not completely formed was denoted by X.

Figure 3:
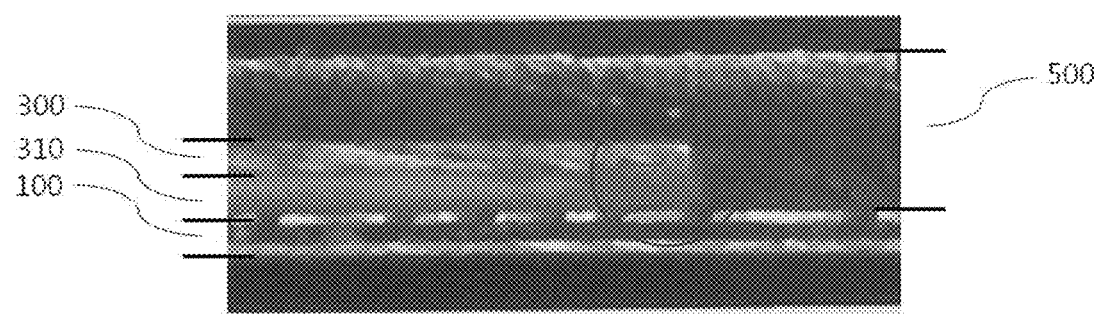
FIG. 3 is a cross sectional view of a semiconductor device according to one embodiment of the present invention.

FIG. 3 shows a microscopic observation of the ground cross section of the semiconductor device manufactured in Example 1-1 of the present invention.

Referring to the portion inside a circle in FIG. 3, in the case of the semiconductor device according to one embodiment of the present invention, it could be confirmed that the second die bonding layer was formed so as to mold a region not overlapping with a first semiconductor chip region in the lower region of the second semiconductor chip.

Figure 4:
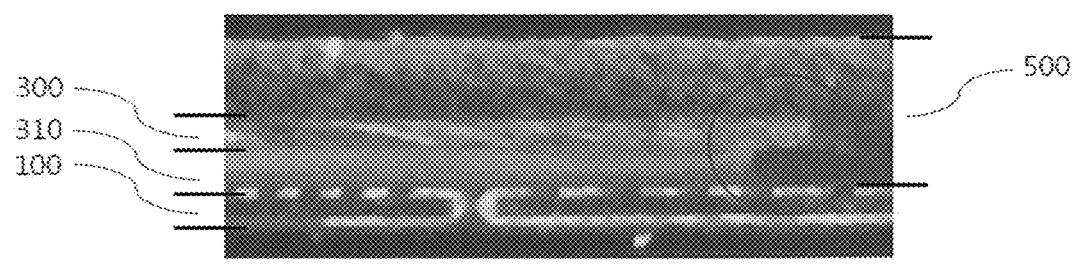
FIG. 4 is a cross sectional view of a semiconductor device according to a comparative example in the present invention.

FIG. 4 is a microscopic observation of the ground cross section of the semiconductor device manufactured in Comparative Example 3-5 of the present invention.

Referring to the portion inside a circle in FIG. 4, in the case of the semiconductor device according to Comparative Examples, the second die bonding layer was not completely molded in a region not overlapping with a first semiconductor chip region in the lower region of the second semiconductor chip and thus some empty space remains.

[Evaluation of Crack Resistance of a Second Semiconductor Chip]

For the semiconductor devices manufactured in the above-described Examples and Comparative Examples.

After lamination of the second semiconductor chip, it was cured in an oven at 125° C. for 1 hour. To a portion not overlapping with a first semiconductor chip region in the upper region of the second semiconductor chip, a gold wire (diameter 25 mu m) having a height of 60 mu was connected via a gold wire (diameter: 25 mu m) having a height of 60 mu by a wire bonding process. And the presence or absence of a crack in the second semiconductor chip was observed with an optical microscope. The case where no cracking occurred was denoted by 0, and the case where cracking occurred was indicated by X.

The results of the evaluation of the molding property and crack resistance were summarized in Table 1 below.

TABLE 1

| | Second die bonding layer Viscosity of adhesive layer(Paac) | Evaluation of molding property | Evaluation of crack resistance |
|---|---|---|---|
| Example 1-1 | 1,200 | ◯ | ◯ |
| Example 1-2 | 1,800 | ◯ | ◯ |
| Example 1-3 | 1,650 | ◯ | ◯ |

TABLE 1-continued

| | Second die bonding layer Viscosity of adhesive layer(Pa·s) | Evaluation of molding property | Evaluation of crack resistance |
|---|---|---|---|
| Example 1-4 | 1,500 | ○ | ○ |
| Comparative Example 1-5 | 3,600 | X | X |
| Comparative Example 1-6 | 12,400 | X | X |
| Comparative Example 1-7 | 5,600 | X | X |

Referring to Table 1 above, it could be confirmed that the semiconductor device according to examples of the present invention was configured such that the second die bonding layer was formed so as to mold a region not overlapping with a first semiconductor chip region in the lower region of the second semiconductor chip, and thus exhibited excellent molding property and crack resistance, as compared with the semiconductor device according to the Comparative Examples.

DESCRIPTION OF REFERENCE NUMERALS

100: substrate
200: first semiconductor chip
210: First die bonding layer
300: second semiconductor chip
310: second die bonding layer
400: Wire
500: External protective layer

The invention claimed is:

1. A semiconductor device comprising:
a substrate;
a first semiconductor chip die-bonded by a first die bonding layer onto the substrate; and
a second semiconductor chip die-bonded by a second die bonding layer onto the first semiconductor chip, wherein the second die bonding layer is formed so as to mold a region not overlapping with a region of the first semiconductor chip in the lower region of the second semiconductor chip,
wherein the first semiconductor chip is disposed in a recess extending into the second die bonding layer, and the second die bonding layer comprises a continuous layer,
wherein the first die bonding layer and the second die bonding layer includes an adhesive layer containing an epoxy resin and a curing agent,
wherein the adhesive layer contained in the second die-bonding layer has a viscosity before curing of 3000 Pa·s or less at 130° C., and
wherein the adhesive layer contained in the second die-bonding layer includes a low-elastic, high-molecular weight resin that is blended with the epoxy resin, the low-elastic, high-molecular weight resin exhibiting viscoelasticity after formation of the crosslinked structure.

2. The semiconductor device of claim 1, further comprising one to five die-bonded semiconductor chips between the substrate and the first die bonding layer.

3. The semiconductor device of claim 1 wherein the first and second die bonding layers have a thickness of 1 to 160 um.

4. A semiconductor device, comprising:
a substrate;
a first semiconductor chip die-bonded by a first die bonding layer onto the substrate; and
a second semiconductor chip die-bonded by a second die bonding layer onto the first semiconductor chip, wherein the second die bonding layer is formed so as to mold a region not overlapping with a region of the first semiconductor chip in the lower region of the second semiconductor chip,
wherein the first semiconductor chip is disposed in a recess extending into the second die bonding layer, and the second die bonding layer comprises a continuous layer,
wherein the first die bonding layer and the second die bonding layer includes an adhesive layer containing an epoxy resin and a curing agent, and
wherein the adhesive layer contained in the second die-bonding layer includes a low-elastic, high-molecular weight resin that is blended with the epoxy resin, the low-elastic, high-molecular weight resin exhibiting viscoelasticity after formation of the crosslinked structure.

5. The semiconductor device of claim 4, wherein the adhesive layer contained in the second die-bonding layer includes a filler having an average particle size between about 0.005 μm and about 1 μm.

* * * * *